(12) United States Patent
Chen

(10) Patent No.: US 11,362,198 B2
(45) Date of Patent: Jun. 14, 2022

(54) SEMICONDUCTOR STRUCTURE AND METHOD OF FORMING THE SAME

(71) Applicants: TAIWAN SEMICONDUCTOR MANUFACTURING CO., LTD., Hsinchu (TW); TSMC CHINA COMPANY LIMITED, Shanghai (CN)

(72) Inventor: Zheng-Long Chen, New Taipei (TW)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 16/933,706

(22) Filed: Jul. 20, 2020

(65) Prior Publication Data

US 2022/0005949 A1 Jan. 6, 2022

(30) Foreign Application Priority Data

Jul. 2, 2020 (CN) .......................... 202010625450.5

(51) Int. Cl.
*H01L 29/66* (2006.01)
*H01L 21/762* (2006.01)
(Continued)

(52) U.S. Cl.
CPC .. *H01L 29/66681* (2013.01); *H01L 21/76205* (2013.01); *H01L 29/063* (2013.01);
(Continued)

(58) Field of Classification Search
CPC .......... H01L 29/66681; H01L 29/7835; H01L 29/7816; H01L 29/063; H01L 29/0856–0865; H01L 21/76202–76205
See application file for complete search history.

(56) References Cited

U.S. PATENT DOCUMENTS 5,349,225 A * 9/1994 Redwine ............. H01L 29/6659
257/408
5,675,166 A * 10/1997 Ilderem ............... H01L 29/6656
257/E29.054
(Continued)

FOREIGN PATENT DOCUMENTS

CN 102306659 A 1/2012
TW 201405774 A 2/2014

*Primary Examiner* — Errol V Fernandes
*Assistant Examiner* — Jeremy J Joy
(74) *Attorney, Agent, or Firm* — Maschoff Brennan

(57) ABSTRACT

A method of forming a semiconductor structure including: forming a drift well in a substrate, in which the drift well includes first dopants having a first conductivity type; forming an isolation structure over the drift well; forming a well region in the drift well and spaced apart from the isolation structure, such that a top portion of the drift well is between the well region and the isolation structure; doping the top portion with second dopants having a second conductivity type different from the first conductivity type, such that a doping concentration of the second dopants in the top portion is lower than a doping concentration of the first dopants in the top portion after doping the top portion; and forming a gate structure extending from the isolation structure to the well region and covering the top portion of the drift well.

20 Claims, 22 Drawing Sheets

(51) Int. Cl.
*H01L 29/06* (2006.01)
*H01L 29/08* (2006.01)
*H01L 29/78* (2006.01)

(52) U.S. Cl.
CPC ...... *H01L 29/0865* (2013.01); *H01L 29/0878* (2013.01); *H01L 29/0882* (2013.01); *H01L 29/7816* (2013.01)

(56) References Cited

U.S. PATENT DOCUMENTS

| | | | | |
|---|---|---|---|---|
| 6,171,913 B1 * | 1/2001 | Wang | ................ | H01L 21/26586 257/E21.345 |
| 6,198,131 B1 * | 3/2001 | Tung | ................... | H01L 29/1045 257/E29.267 |
| 6,372,587 B1 * | 4/2002 | Cheek | ............... | H01L 29/66659 257/E21.345 |
| 6,773,997 B2 * | 8/2004 | Imam | .................. | H01L 29/0878 257/E29.268 |
| 8,624,322 B1 * | 1/2014 | Su | ....................... | H01L 27/0629 438/238 |
| 9,269,808 B2 * | 2/2016 | Lin | .................... | H01L 21/26513 |
| 2007/0181919 A1 | 8/2007 | Tsai et al. | | |
| 2008/0182394 A1 * | 7/2008 | Yang | ................ | H01L 29/66659 438/510 |
| 2012/0058608 A1 | 3/2012 | Cheng et al. | | |
| 2012/0205738 A1 * | 8/2012 | Yang | .................. | H01L 29/7801 257/E21.409 |
| 2014/0027840 A1 | 1/2014 | Guan et al. | | |
| 2014/0145262 A1 | 5/2014 | Pan et al. | | |
| 2014/0191792 A1 * | 7/2014 | Chan | .................. | H01L 29/0865 327/434 |
| 2017/0213893 A1 * | 7/2017 | Edwards | ........... | H01L 29/42368 |
| 2017/0263759 A1 | 9/2017 | Chung et al. | | |
| 2019/0229213 A1 * | 7/2019 | Ko | .................... | H01L 29/66681 |
| 2019/0348533 A1 * | 11/2019 | Huang | ............. | H01L 21/76202 |
| 2020/0105926 A1 * | 4/2020 | Huang | ............. | H01L 29/66689 |

\* cited by examiner

SEMICONDUCTOR STRUCTURE AND METHOD OF FORMING THE SAME

PRIORITY CLAIM AND CROSS-REFERENCE

This application claims priority to China Application Serial Number 202010625450.5, filed Jul. 2, 2020, which is herein incorporated by reference in its entirety.

BACKGROUND

The semiconductor integrated circuit (IC) industry has experienced rapid growth. Technological advances in integrated circuit materials and design have produced generations of integrated circuits where each generation has smaller and more complex circuits than the previous generation. However, these advances have increased the complexity of processing and manufacturing integrated circuits and, for these advances to be realized, similar developments in integrated circuit processing and manufacturing are needed. In the course of integrated circuit evolution, functional density has generally increased while geometry size has decreased.

The decreased geometry size leads to challenges in fabricating a type of transistor device known as a laterally diffused metal-oxide-semiconductor (LDMOS) transistor. The LDMOS transistor has a locos oxidation of silicon (LOCOS) structure formed over a silicon wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
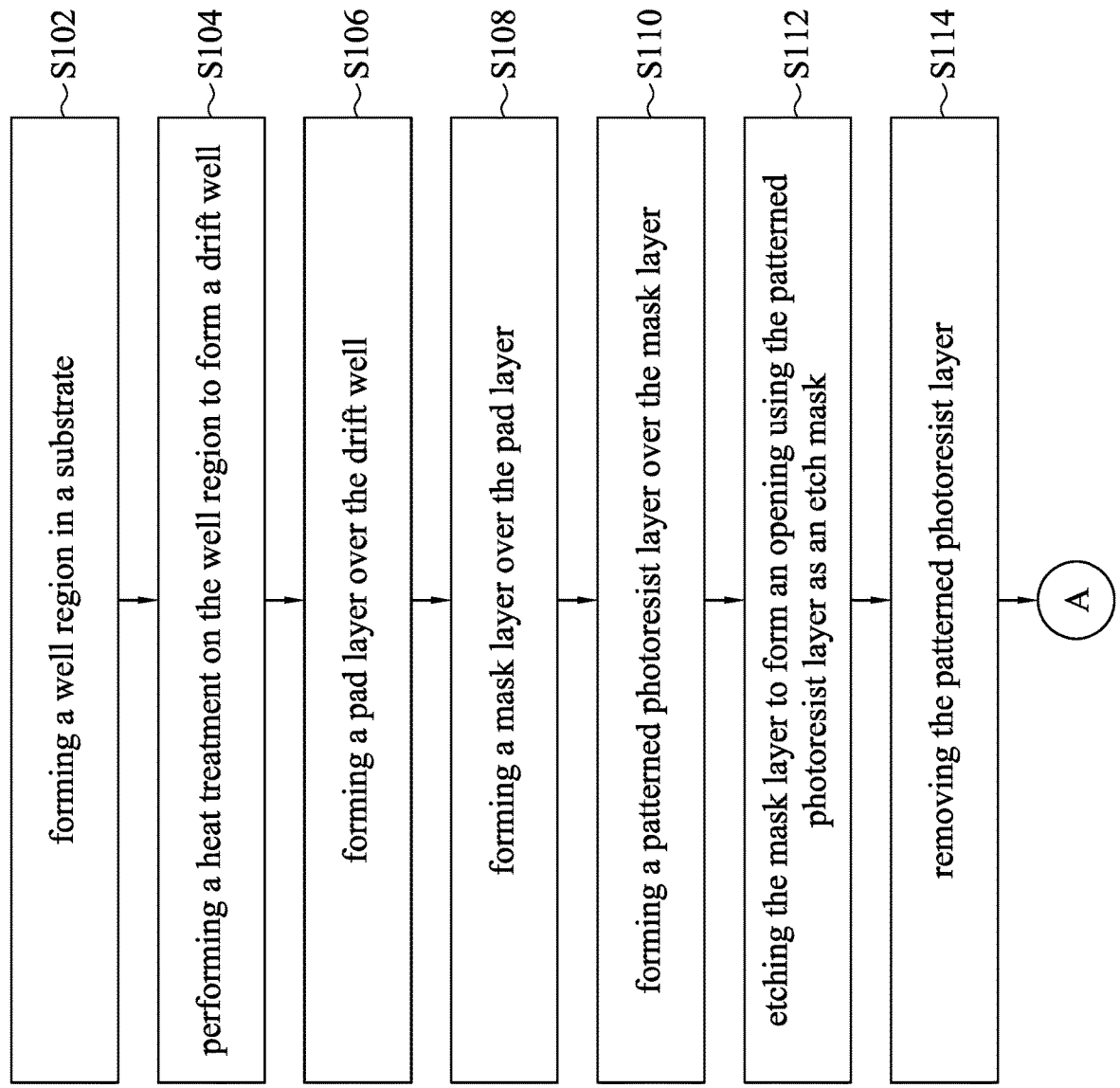
FIGS. 1A and 1B are a flow chart illustrating a method of forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
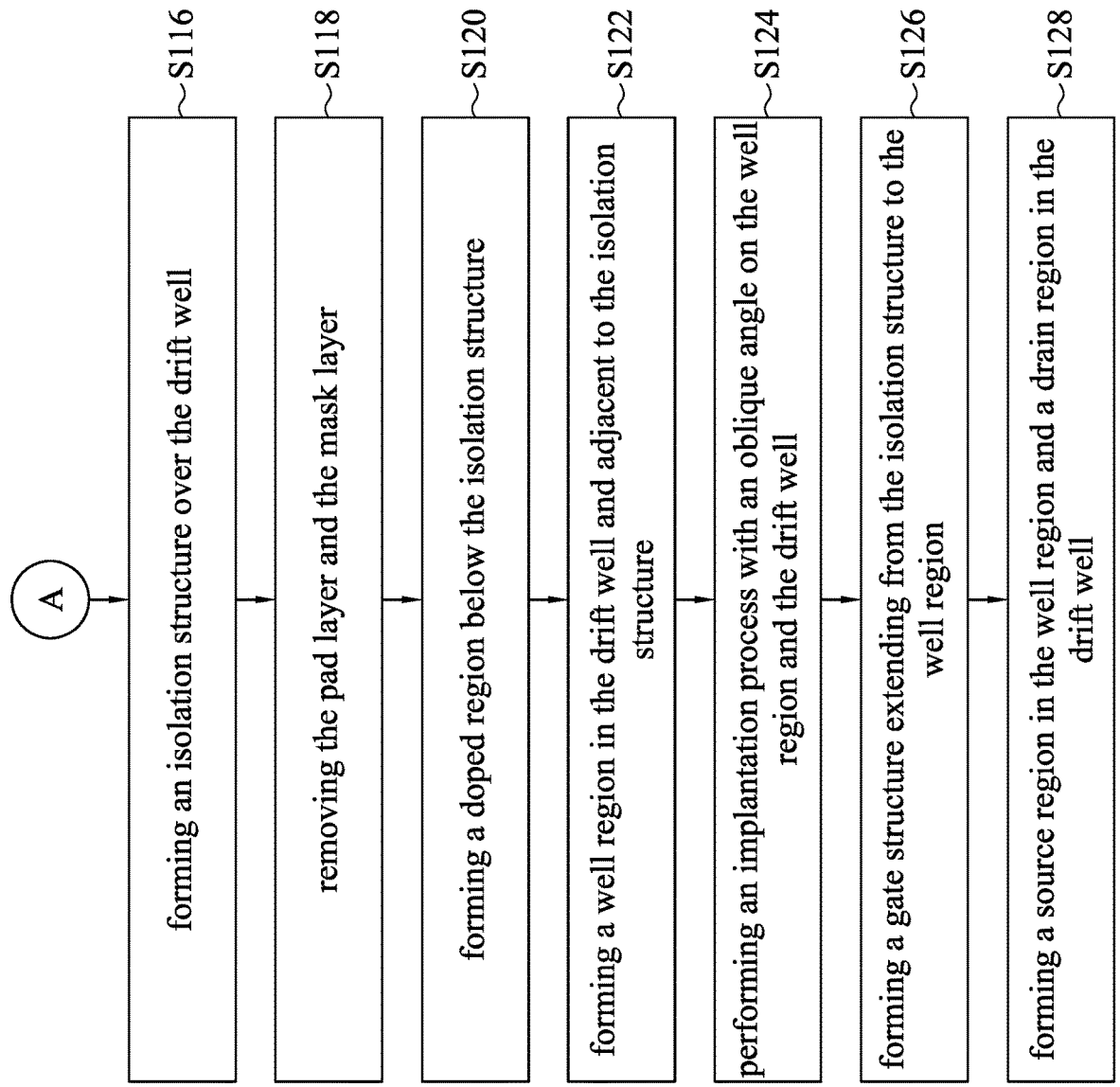

FIGS. 1A and 1B are a flow chart illustrating a method 100 of forming a semiconductor structure 200 in accordance with some embodiments of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. FIGS. 2-15 are cross-sectional views illustrating the method 100 for forming the semiconductor structure 200 at various stages in accordance with some embodiments of the present disclosure. The semiconductor structure 200 may be a laterally diffused metal-oxide-semiconductor (LDMOS) transistor, for example, an ultra-high voltage LDMOS transistor.

Figure 2:
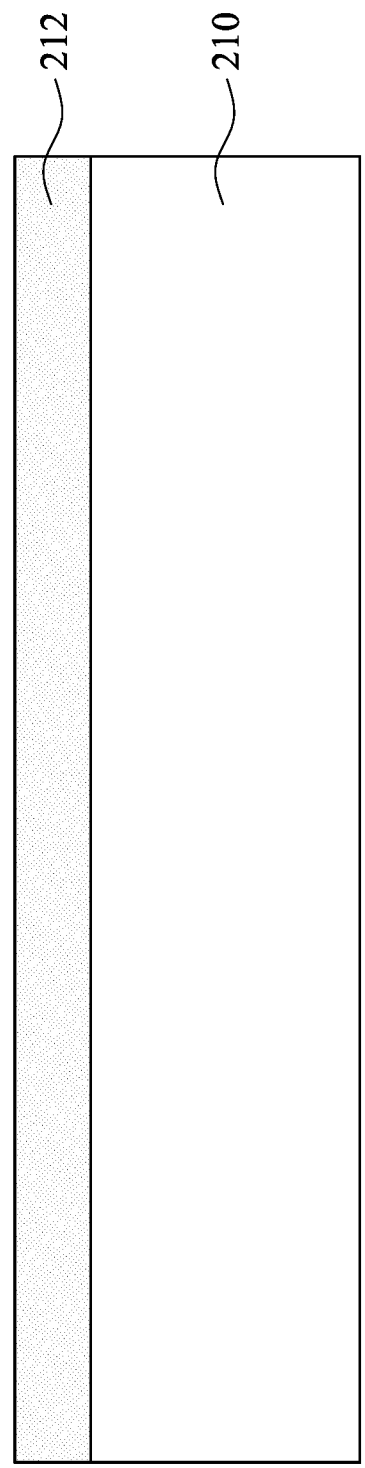
FIGS. 2-15 are cross-sectional views illustrating the method for forming the semiconductor structure at various stages in accordance with some embodiments of the present disclosure.

Referring to FIG. 1A and FIG. 2, the method 100 begins with operation S102 in which a well region 212 is formed in a substrate 210. The well region 212 may be formed by doping the substrate 210 with first dopants having first conductivity type (e.g., N-type in this case) such as phosphorous (P), arsenic (As), antimony (Sb), combinations thereof, or the like. For example, an implantation process is performed on the substrate 210 to form the well region 212, followed by an annealing process (e.g., the heat treatment described in FIG. 3) to activate the implanted dopants of the well region 212. In some embodiments, the substrate 210 may include a semiconductor wafer such as a silicon wafer. In some other embodiments, the substrate 210 is doped with dopants having second conductivity type (e.g., P-type in this case) such as boron (B), $BF_2$, $BF_3$, combinations thereof, or the like. Alternatively, the substrate 210 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
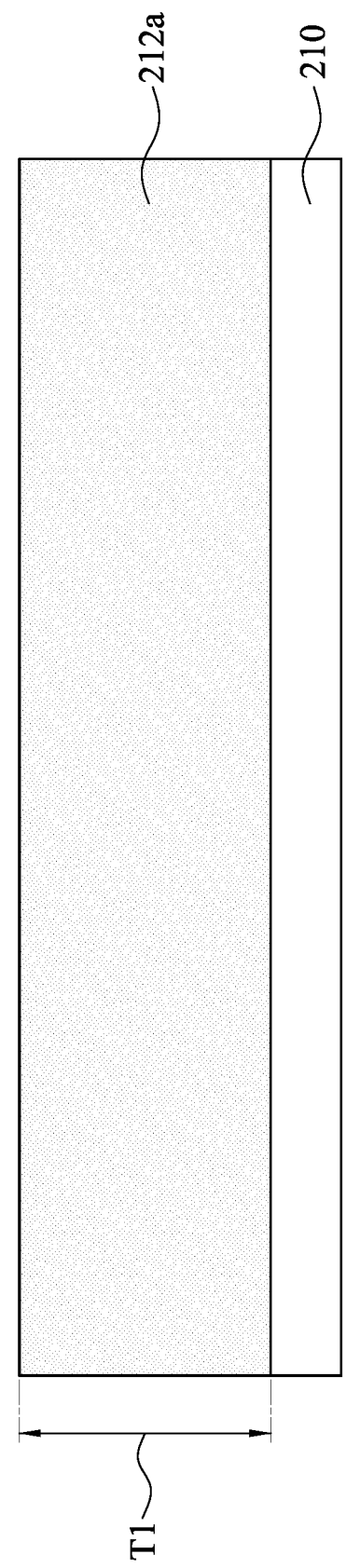

Referring to FIG. 1A, FIG. 2, and FIG. 3, the method 100 continues with operation S104 in which a heat treatment (e.g., the aforementioned annealing process) is performed on the well region 212 to form a drift well 212a. The heat treatment is performed by heating the well region 212 at a temperature in a range of 800 degrees Celsius to 1200 degrees Celsius, which is also called a thermal drive-in treatment. As such, the dopants of the well region 212 is diffused and thus the well region 212 is expanded to form the drift well 212a in the substrate 210. In some embodiments, the drift well 212a has a thickness T1 of about 2 μm to about 15 μm. In some embodiments, the drift well 212a has a doping concentration in a range of about 1E13 atoms/cm$^3$ to about 1E17 atoms/cm$^3$.

For ease of explanation, it is assumed that in FIGS. 2-15, the first conductivity type is N-type, and the second conductivity type is P-type. In some embodiments, the drift well 212a has greater doping concentration of the N-type dopants than the doping concentration of the N-type dopants of the substrate 210 (e.g., substantially zero). Further, when the substrate 210 is a P-type substrate, the drift well 212a includes both N-type dopants and P-type dopants. The amount of the P-type dopants in the drift well 212a, however, is much less than the amount of the N-type dopants in the drift well 212a. As such, a net doping concentration of the drift well 212a is substantially the doping concentration of the N-type dopants of the drift well 212a.

It is noted that the term of "net doping concentration" herein means that a difference between a doping concentration of N-type dopants and a doping concentration of P-type dopants in the same region. For example, the net doping concentration in the drift well 212a is a difference between the doping concentration of the N-type dopants doped in operations S102 and S104 and the doping concentration of the P-type dopants doped in the substrate 210.

Figure 4:
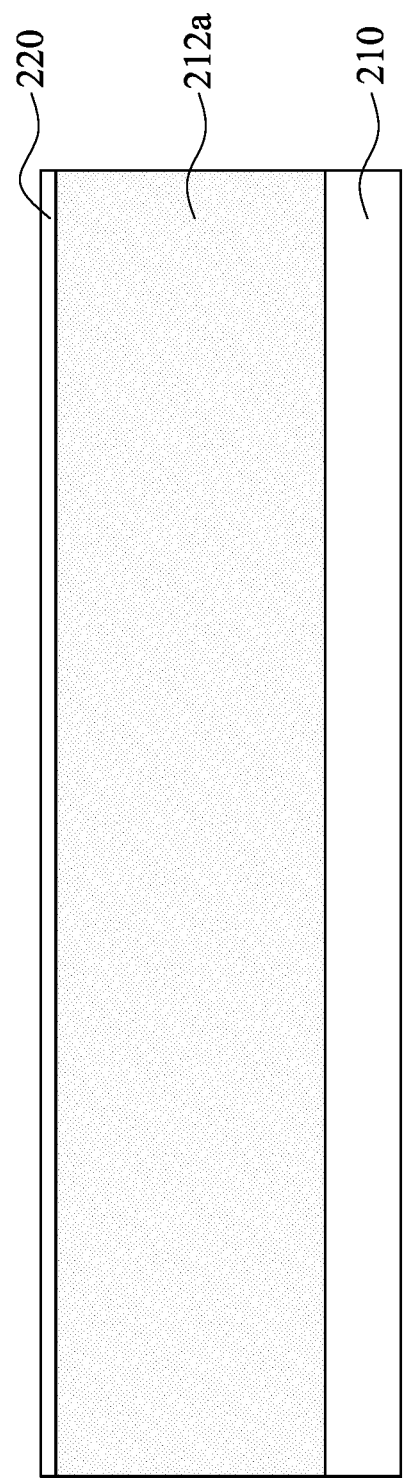

Referring to FIG. 1A and FIG. 4, the method 100 continues with operation S106 in which a pad layer 220 is formed over the drift well 212a. The pad layer 220 is deposited over the drift well 212a by suitable techniques, such as atomic layer deposition (ALD), chemical vapor deposition (CVD), physical vapor deposition (PVD), thermal oxidation, combinations thereof, or other suitable techniques. For example, the pad layer 220 may be grown at a temperature in a range of about 900 degrees Celsius to about 1000 degrees Celsius in an oxygen steam ambient environment, to form a layer of a thickness in a range of about 100 Angstroms to about 500 Angstroms. In some embodiments, the pad layer 220 is a thin pad oxide layer, and the pad layer 220 is made of silicon oxide or other suitable materials.

Figure 5:
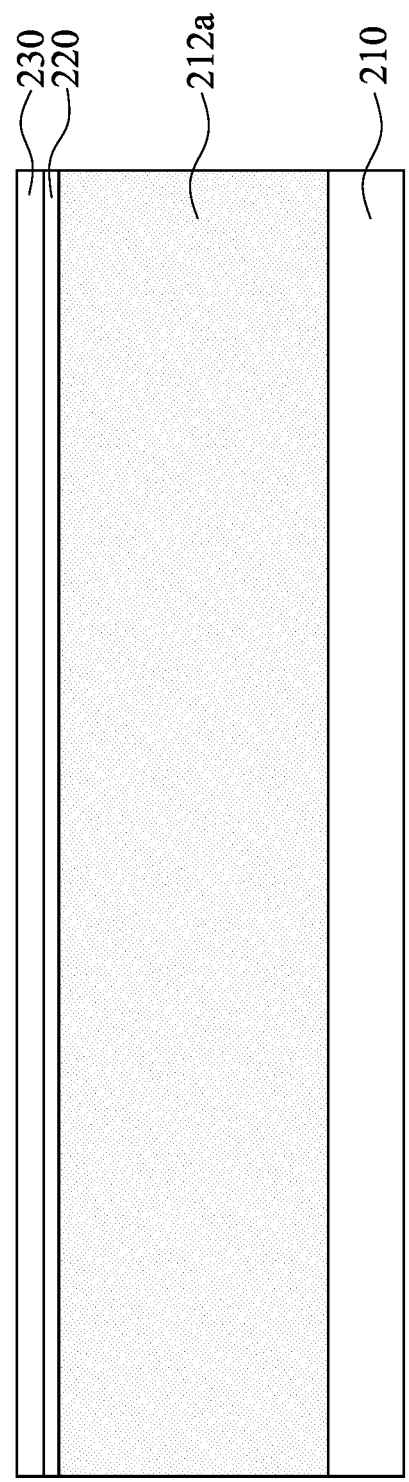

Referring to FIG. 1A and FIG. 5, the method 100 continues with operation S108 in which a mask layer 230 is formed over the pad layer 220. The mask layer 230 is deposited over the pad layer 220 by suitable techniques, such as atomic layer deposition (ALD), chemical vapor deposition (CVD), physical vapor deposition (PVD), combinations thereof, or other suitable techniques. For example, plasma-enhanced vapor deposition or plasma-enhanced CVD (PECVD) may be used to form the mask layer 230 of a thickness in a range of about 1000 Angstroms to about 2500 Angstroms. In other words, the thickness of the mask layer 230 is greater than the thickness of the pad layer 220. In some embodiments, the mask layer 230 and the pad layer 220 includes different materials. For example, the mask layer 230 is made of silicon nitride or other suitable materials.

Figure 6:
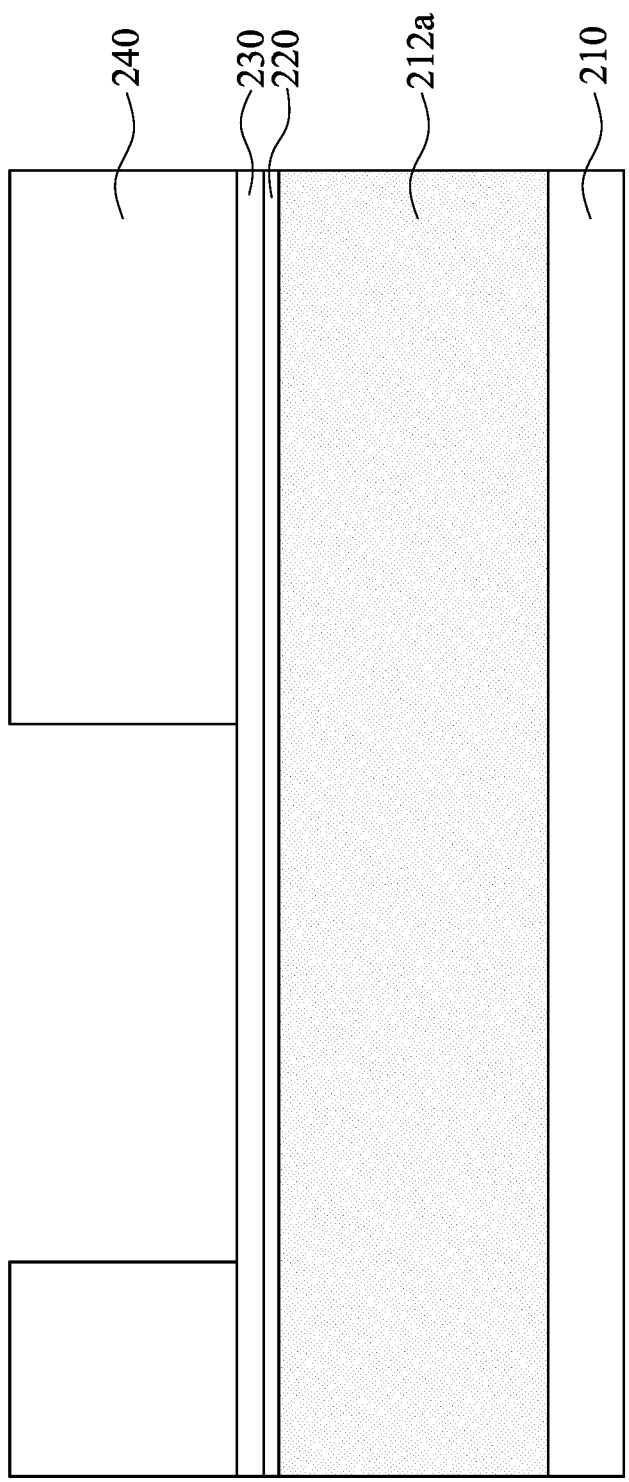

Referring to FIG. 1A and FIG. 6, the method 100 continues with operation S110 in which patterned photoresist layer 240 is formed over the mask layer 230. In greater details, the patterned photoresist layer 240 is formed by forming a photoresist layer over the mask layer 230 and patterning the photoresist layer into the patterned photoresist layer 240 by using suitable photolithography techniques. For example, after spin-on coating the photoresist layer onto the mask layer 230, the photoresist layer is exposed to a pattern of light radiation. In some embodiments, the patterned photoresist layer 240 covers a portion of the mask layer 230, and the other portions of the mask layer 230 are exposed.

Figure 7:
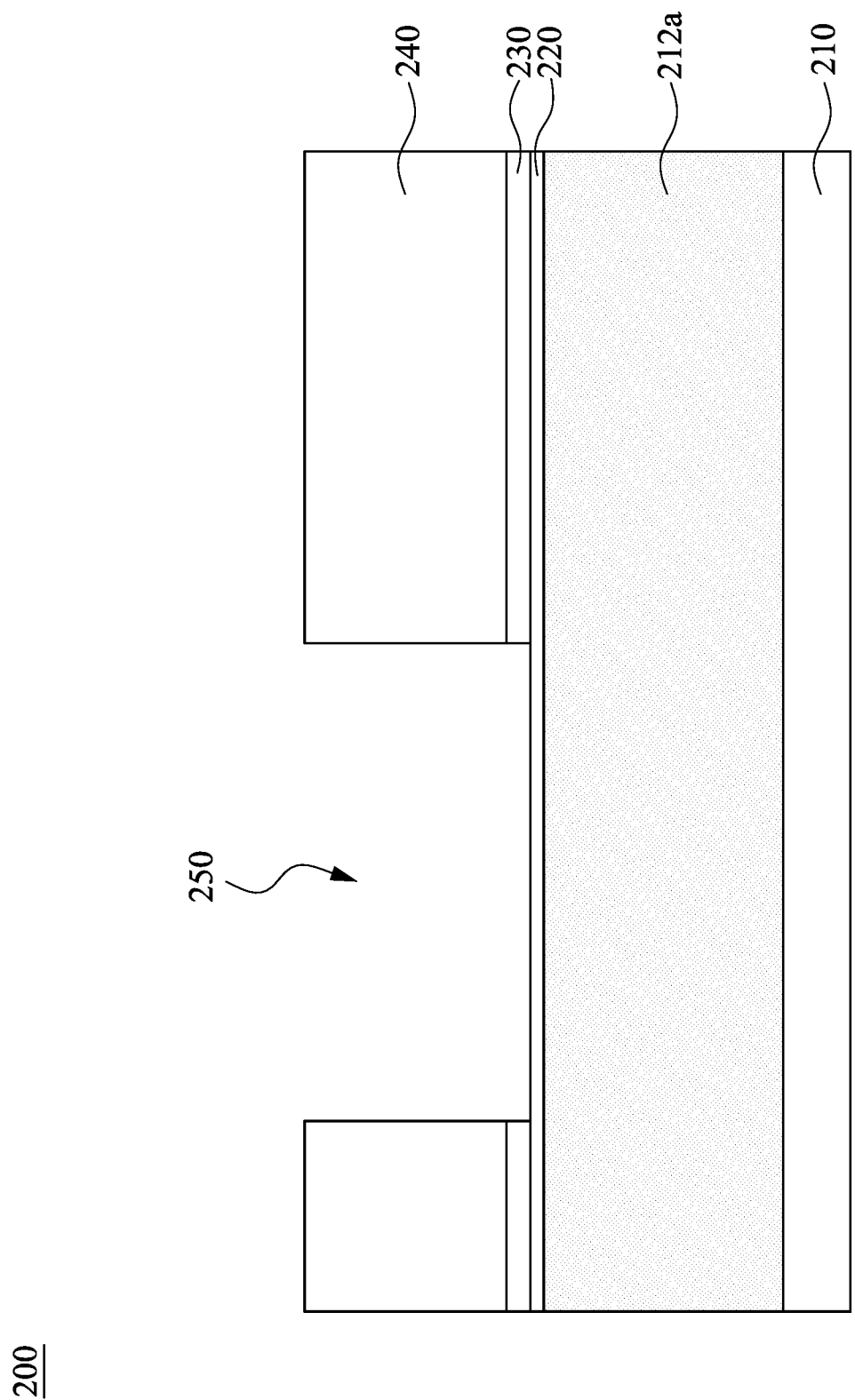

Referring to FIG. 1A and FIG. 7, the method 100 continues with operation S112 in which the mask layer 230 is etched to form an opening 250 using the patterned photoresist layer 240 as an etch mask. The mask layer 230 is etched until the pad layer 220 is exposed. In other words, after forming the opening 250, the pad layer 220 still covers the underlying drift well 212a. The mask layer 230 is etched, for example, using anisotropic etch processes such as reactive ion etching (RIE) using chlorine ($Cl_2$), HBr or $CF_4$ as an etchant for the mask layer 230. In some embodiments, the opening 250 is formed in the mask layer 230.

Figure 8:
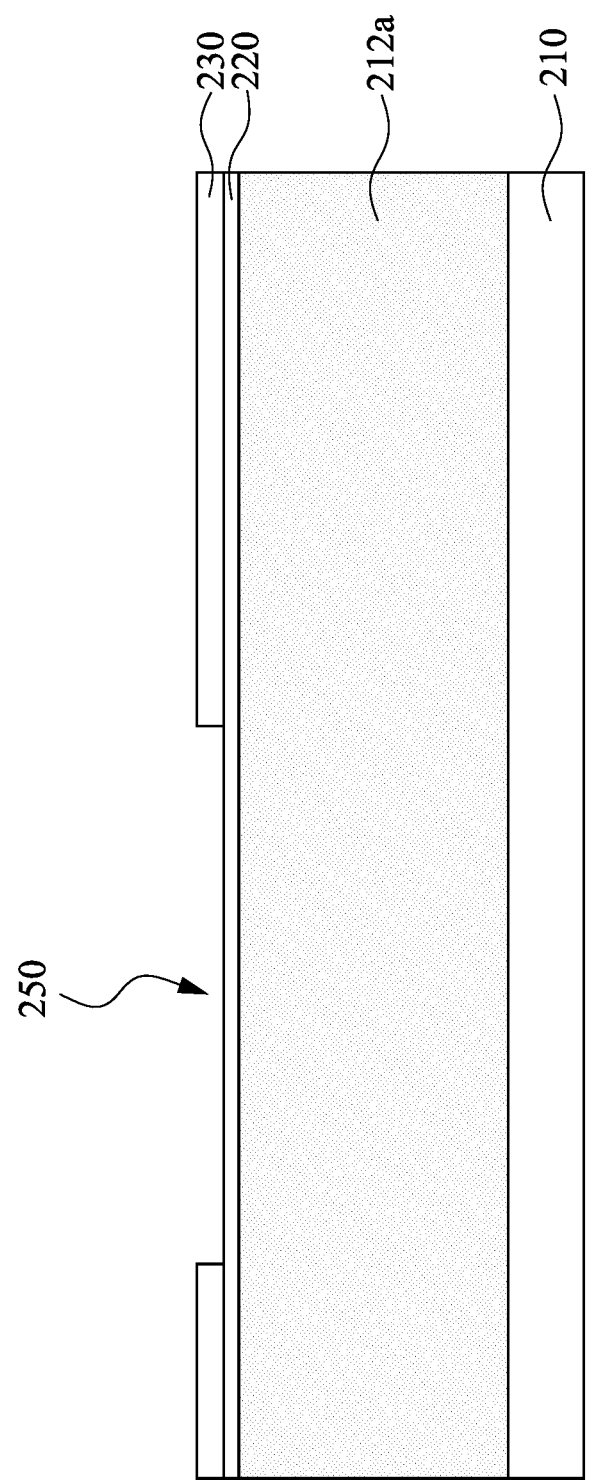

Referring to FIG. 1A and FIG. 8, the method 100 continues with operation S114 in which the patterned photoresist layer 240 is removed. In some embodiments, removing the patterned photoresist layer 240 may be performed by using a photoresist strip process, such as an ashing process, and etching process, or other suitable processes.

Figure 9:
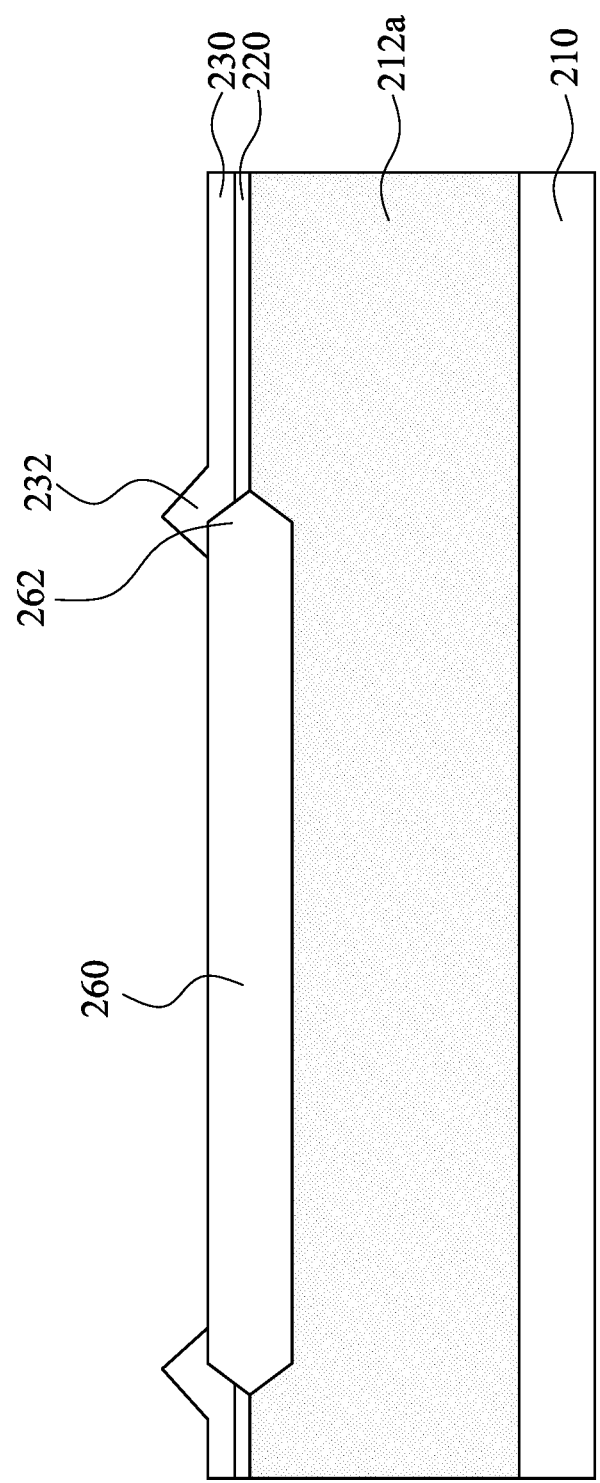

Referring to FIG. 1B and FIG. 9, the method 100 continues with operation S116 in which an isolation structure 260 is formed over the drift well 212a. The isolation structure 260 has a peak portion 262 in contact with the drift well 212a, the pad layer 220, and the mask layer 230. The mask layer 230 has a curved portion 232 covers the peak portion 262 of the isolation structure 260. In some embodiments, the isolation structure 260 may be formed by performing a dry etching to form a trench in the pad layer 220 and the drift well 212a, and then filling the trench with insulator materials such as silicon oxide, silicon nitride, or silicon oxynitride. The filled trench may have a multi-layer structure such as a thermal oxide liner filled with silicon nitride or silicon oxide in order to improve the trench interface. In the present embodiments, the isolation structure 260 is a shallow trench isolation (STI) structure or a local oxidation of silicon (LOCUS) structure.

In some embodiments, forming the isolation structure 260 includes performing a thermal oxidation process, which is performed in temperatures ranging from 800 degrees Celsius to 1200 degrees Celsius. During the growth of the thermal oxide, the mask layer 230 is pushed upwards and has the curved portion 232. The pad layer 220 (e.g., pad oxide) is configured to decrease tension in the drift well 212a and avoid occurring plastic deformation to damage the semiconductor structure 200. Accordingly, at high temperature (e.g., from 800 degrees Celsius to 1200 degrees Celsius), the viscosity of the pad layer 220 decreases and the stress created between the drift well 212a and the mask layer 230 by the growth of the thermal oxide is relieved.

Figure 10:
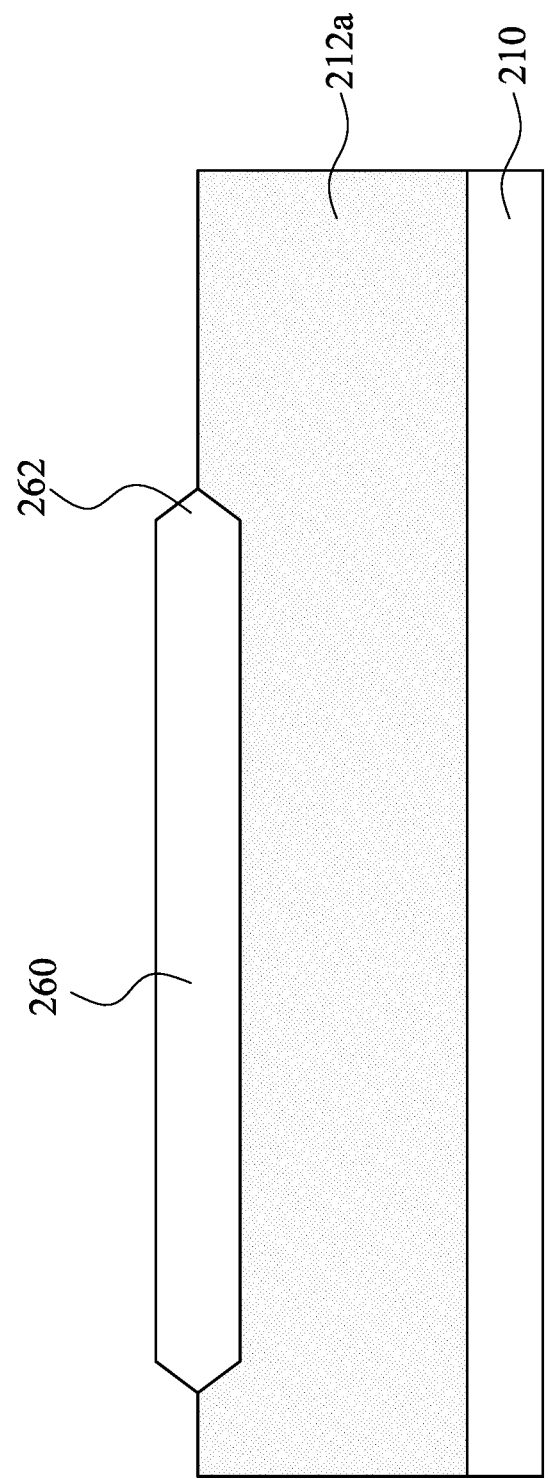

Referring to FIG. 1B and FIG. 10, the method 100 continues with operation S118 in which the pad layer 220 and the mask layer 230 (see FIG. 9) are removed. In greater details, the pad layer 220 and the mask layer 230 are removed such that the peak portion 262 of the isolation structure 260 and the drift well 212a are exposed. In some embodiments, an etching process is performed to etch back and planarize before removing the pad layer 220 and the mask layer 230.

Figure 11:
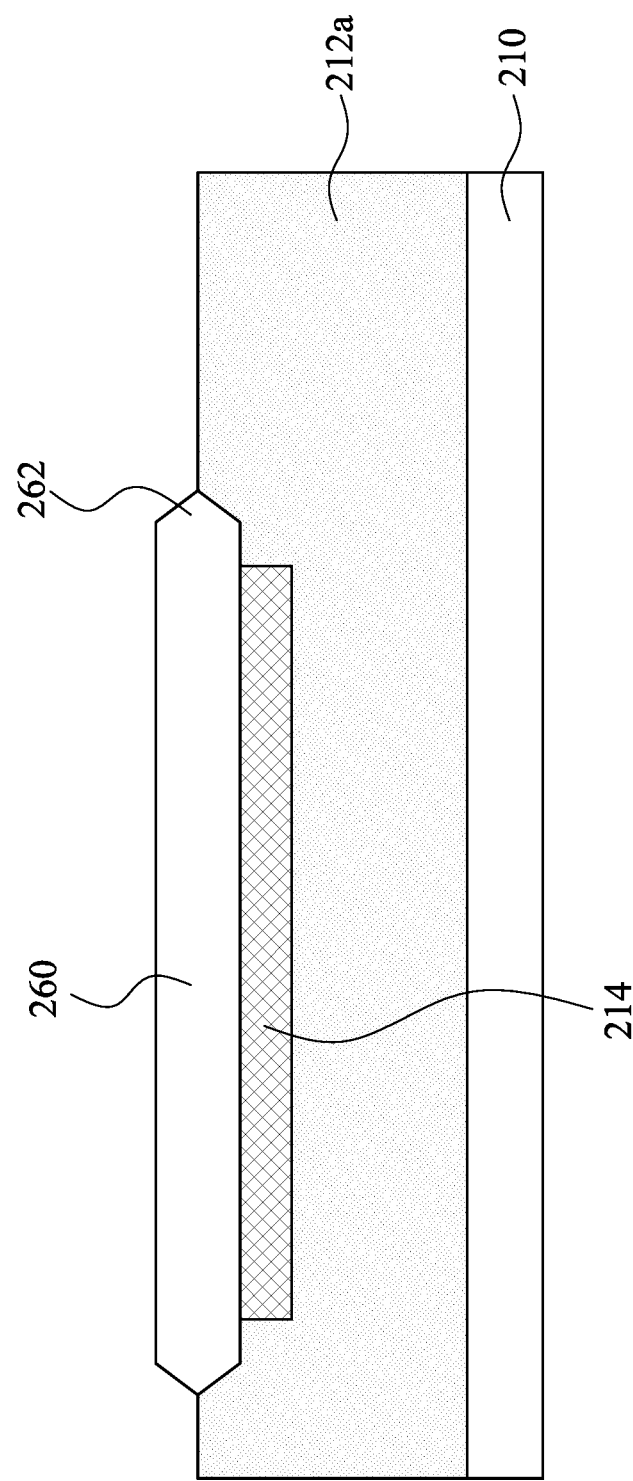

Referring to FIG. 1B and FIG. 11, the method 100 continues with operation S120 in which a doped region 214 is formed below the isolation structure 260. In greater details, the doped region 214 may formed by doping the drift well 212a through the isolation structure 260 with P-type dopants such as boron (B), $BF_2$, $BF_3$, combinations thereof, or the like. For example, an implantation process is performed on the drift well 212a, followed by an annealing process to activate the implanted dopants. The purpose of forming the doped region 214 is to achieve higher breakdown voltage. In some embodiments, the doped region 214 is in contact with the isolation structure 260. In some embodiments, a length of the isolation structure 260 is greater than a length of the doped region 214. That is, the isolation structure 260 completely covers the doped region 214.

In some embodiments, the doped region 214 has a doping concentration in a range of about 1E15 atoms/cm$^3$ to about 1E17 atoms/cm$^3$. The doped region 214 has greater doping concentration of the P-type dopants than the doping concentration of the P-type dopants of the drift well 212a. The doped region 214 includes both N-type dopants and P-type dopants. The amount of the P-type dopants in the doped region 214, however, is much greater than the amount of the N-type dopants in the doped region 214. As such, a net doping concentration of the doped region 214 is substantially the doping concentration of the P-type dopants of the doped region 214 doped in operation 120.

Figure 12:
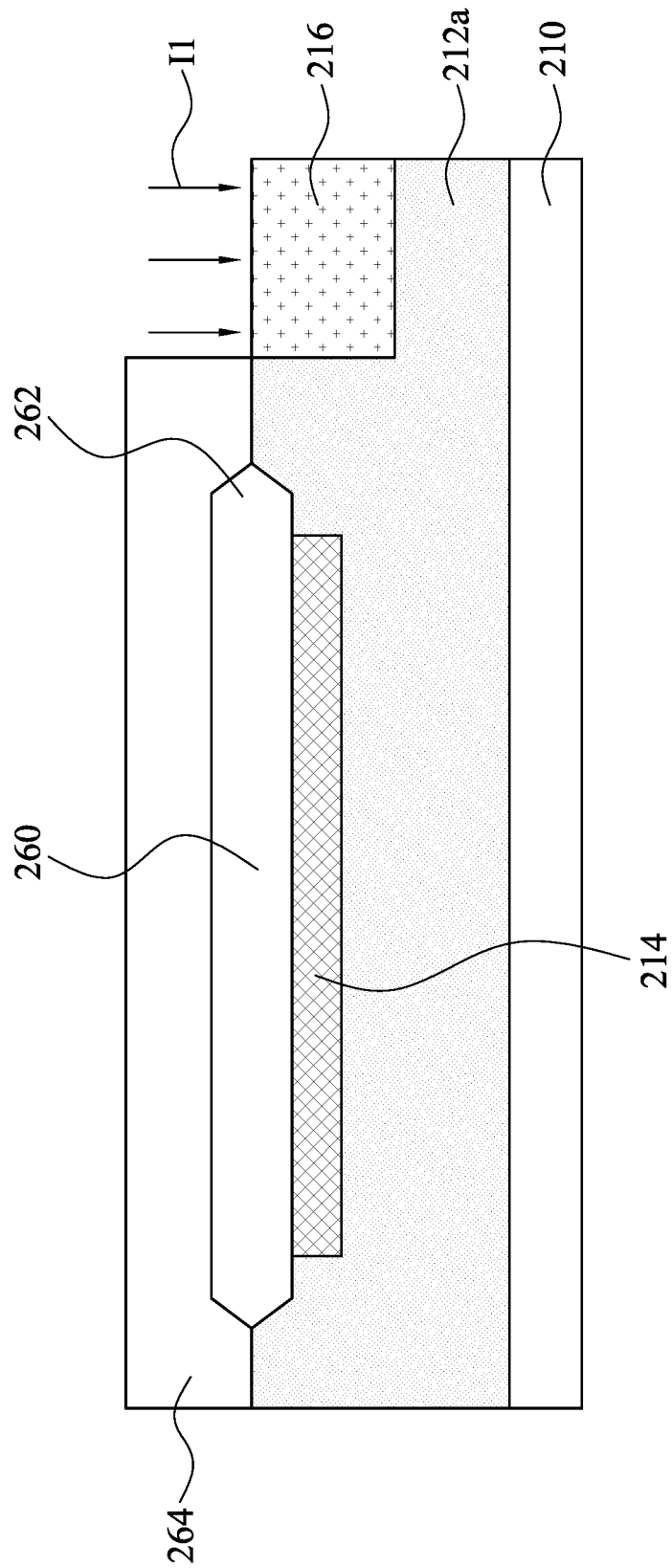

Referring to FIG. 1B and FIG. 12, the method 100 continues with operation S122 in which a well region 216 is formed in the drift well 212a and adjacent to the isolation structure 260. In greater details, a mask 264 is formed above the structure of FIG. 11 (i.e., above the isolation structure 260 and the drift well 212a), and the mask 264 exposes a portion of the drift well 212a. Subsequently, the well region 216 is formed by doping the drift well 212a with P-type dopants such as boron (B), $BF_2$, $BF_3$, combinations thereof, or the like through the mask 264. For example, an implantation process I1 is performed on the drift well 212a, followed by an annealing process to activate the implanted dopants. In some embodiments, the well region 216 is formed such that the well region 216 is spaced apart from the isolation structure 260 and the doped region 214. In other words, the doped region 214 and the well region 216 are separated by a portion of the drift well 212a. In some embodiments, the well region 216 is disposed in a corner region of the drift well 212a. Dopants of the well region 216 doped in operation S122 may be same as dopants of the doped region 214 doped in operation 120.

In some embodiments, the well region 216 has a doping concentration of the P-type dopants in a range of about 2E15 atoms/cm$^3$ to about 1E17 atoms/cm$^3$. The well region 216 has greater doping concentration of the P-type dopants than the doping concentration of the P-type dopants of the other portions of the drift well 212a. The well region 216 includes both N-type dopants and P-type dopants. The amount of the P-type dopants in the well region 216, however, is much greater than the amount of the N-type dopants in the well region 216. As such, a net doping concentration of the well region 216 is substantially the doping concentration of the P-type dopants of the well region 216 doped in operation 122.

In some embodiments, as shown in FIG. 12, a top surface of the well region 216 is above than a top surface of the doped region 214, and a bottom surface of the well region 216 is below than a bottom surface of the doped region 214. In some embodiments, a length of the well region 216 is smaller than the length of the doped region 214. A thickness of the well region 216 is greater than a thickness of the doped region 214.

Figure 13:
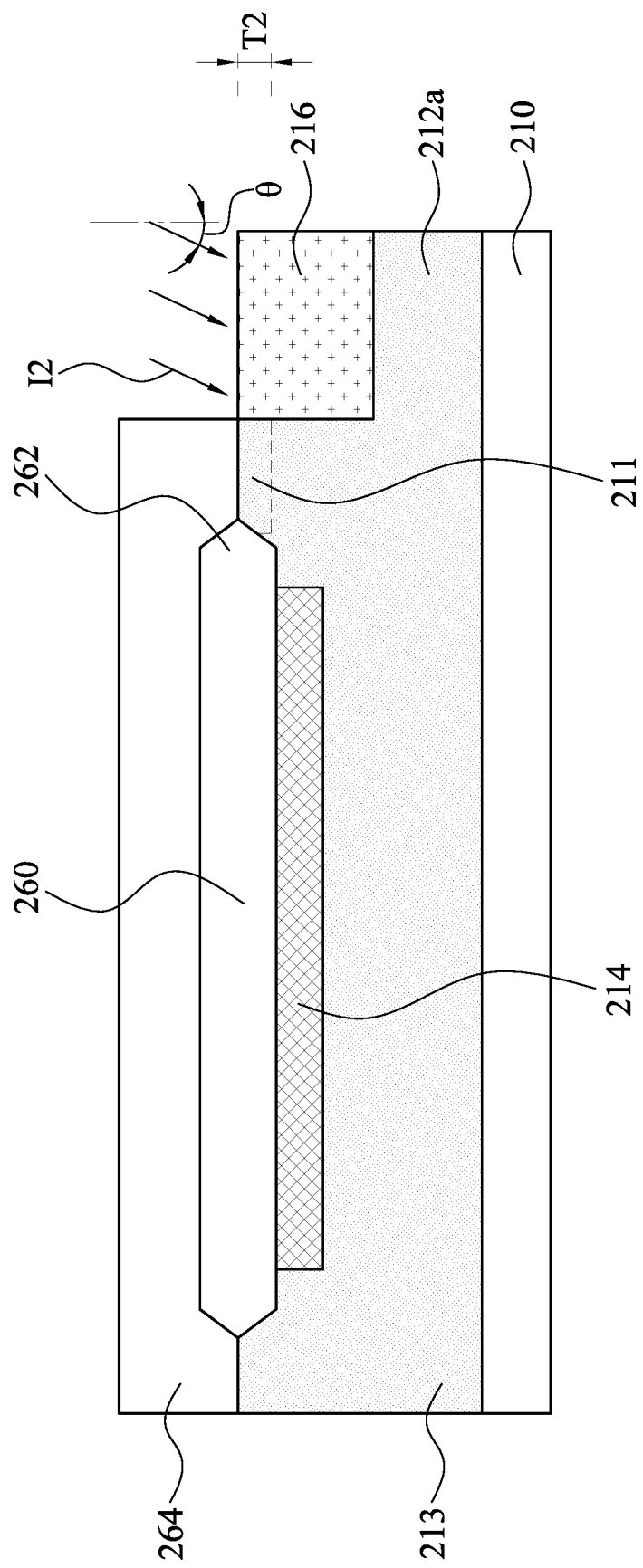

Referring to FIG. 1B and FIG. 13, the method 100 continues with operation S124 in which an implantation process 12, through the mask 264, is performed with an oblique angle θ on the well region 216 and the drift well 212a. In greater details, the well region 216 and the drift well 212a may be doped with P-type dopants such as boron (B), $BF_2$, $BF_3$, combinations thereof, or the like. Thereafter, an annealing process is performed to activate the implanted dopants.

Figure 21:
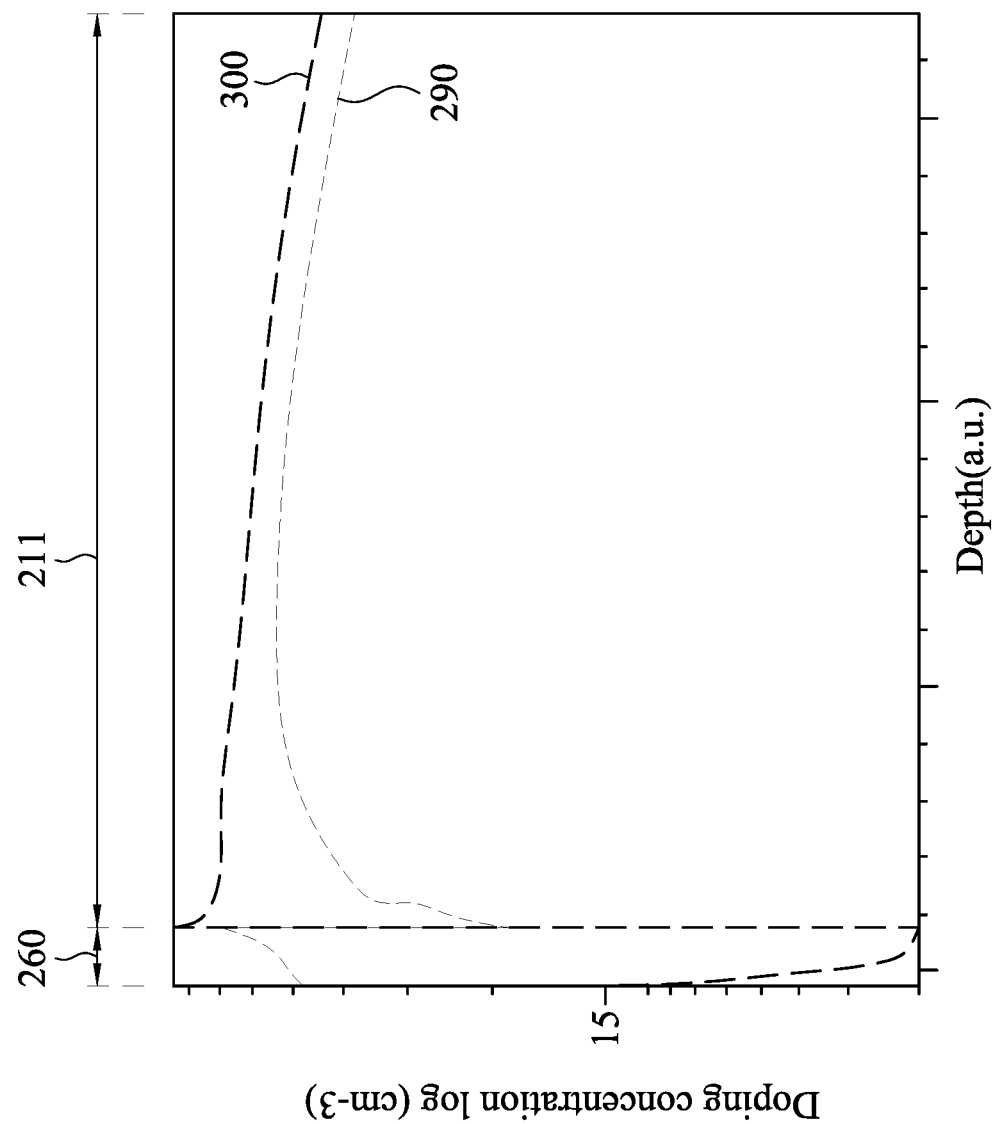
FIG. 21 shows a simulation model of doping concentrations of a drift well in accordance with another embodiment of the present disclosure.

In some embodiments, the implantation process 12 with the oblique angle θ is performed such that the drift well 212a has a non-uniform doping concentration as shown in FIG. 21, which is a simulation model of doping concentrations of the drift well 212a in accordance with another embodiments of the present disclosure. For example, a doping concentration 290 of P-type dopants (e.g., boron in this case) is different from a doping concentration 300 of N-type dopants (e.g., phosphorous in this case). In greater details, the drift well 212a has a top portion 211 (also referred to as a doping modification region 211) and a bottom portion 213 below the top portion 211. The top portion 211 of the drift well 212a is located between the well region 216 and the isolation structure 260. The top portion 211 of the drift well 212a has greater doping concentration of the P-type dopants than the doping concentration of the P-type dopants of the bottom portion 213 of the drift well 212a. In other words, doping the top portion 211 of the drift well 212a with the P-type dopants is performed such that the net doping concentration of the top portion 211 is reduced. The top portion 211 of the drift well 212a remains N-type. As such, the isolation effect of the isolation structure 260 can be maintained and the characteristics of the semiconductor structure would not be influenced. Since the doping concentration of N-type dopants adjacent the peak portion 262 of the isolation structure 260 is reduced to achieve a charge balance, the peak electric field of the peak portion 262 of the isolation structure 260 can be reduced and thus the breakdown voltage can be increased (e.g., about 15%). Accordingly, sufficient breakdown voltage and higher breakdown voltage can be achieved and the performance of the semiconductor structure can be improved.

The net doping concentration in the top portion 211 of the drift well 212a is a difference between the doping concentration of the N-type dopants doped in operations S102 and S104 and the doping concentration of the P-type dopants doped in operation S124. In some embodiments, the doping concentration of the N-type dopants and the doping concentration of the P-type dopants in the top portion 211 have the same order (e.g., about 1E15 atoms/cm$^3$). In some other embodiments, the doping concentration of the N-type dopants and the doping concentration of the P-type dopants in the bottom portion 213 of the drift well 212a have different orders (e.g., 1E15 atoms/cm$^3$ and 1E13 atoms/cm$^3$). Further, since the doping concentration of the P-type dopants doped in operation S124 is lower than the doping concentration of the N-type dopants doped in operation S102, the net doping concentration of the top portion 211 of the drift well 212a is reduced after the operation S124.

As shown in FIG. 12 and FIG. 21, the doping concentration 290 of P-type dopants and the doping concentration 300 of N-type dopants is non-uniform in the drift well 212a. After performing the implantation process 12 with the oblique angle θ, the doping concentration 290 of P-type dopants is lower than the doping concentration 300 of N-type dopants in the top region 211 of the drift well 212a. In other words, the net doping concentration of the top portion 211 of the drift well 212a is reduced.

As shown in FIG. 12 and FIG. 13, an angle of the implantation process I1 is vertical to a lengthwise direction of the drift well 212a, while the implantation process I2 is performed with the oblique angle θ. In some embodiments, the implant process I2 is performed with the oblique angle θ in a range of 5 degrees to 65 degrees. For example, the oblique angle θ is in a range of 7 degrees to 60 degrees. If the angle θ is less than about 5 degrees, then the doping modification region 211 may not in contact with the peak portion 262 of the isolation structure 260, and the breakdown voltage near the peak portion 262 may not be improved; if the angle θ is greater than about 65 degrees, then it may be necessary to increase the concentration of P-type impurities to reduce the concentration loss of large-angle injection. The resulting top portion (doping modification region) 211 of the drift well 212a has a net doping concentration of about 1E12 atoms/cm$^3$ to about 1E15 atoms/cm$^3$. If the net doping concentration of the top portion 211 is greater than about 1E15 atoms/cm$^3$ or less than about 1E12 atoms/cm$^3$, then the charge imbalance may occur, and the breakdown voltage may be reduced, thereby the device characteristics may be reduced.

In some embodiments, a thickness of the top portion 211 of the drift well 212a is smaller than a thickness of the well region 216. For example, the thickness T2 of the top portion 211 of the drift well 212a is in a range of about 0.05 μm to about 3 μm. In some embodiments, the top portion 211 of the drift well 212a is spaced apart from the doped region 214. In some other embodiments, the top portion 211 of the drift well 212a is in contact with the peak portion 262 of the isolation structure 260 and the well region 216.

Figure 14:
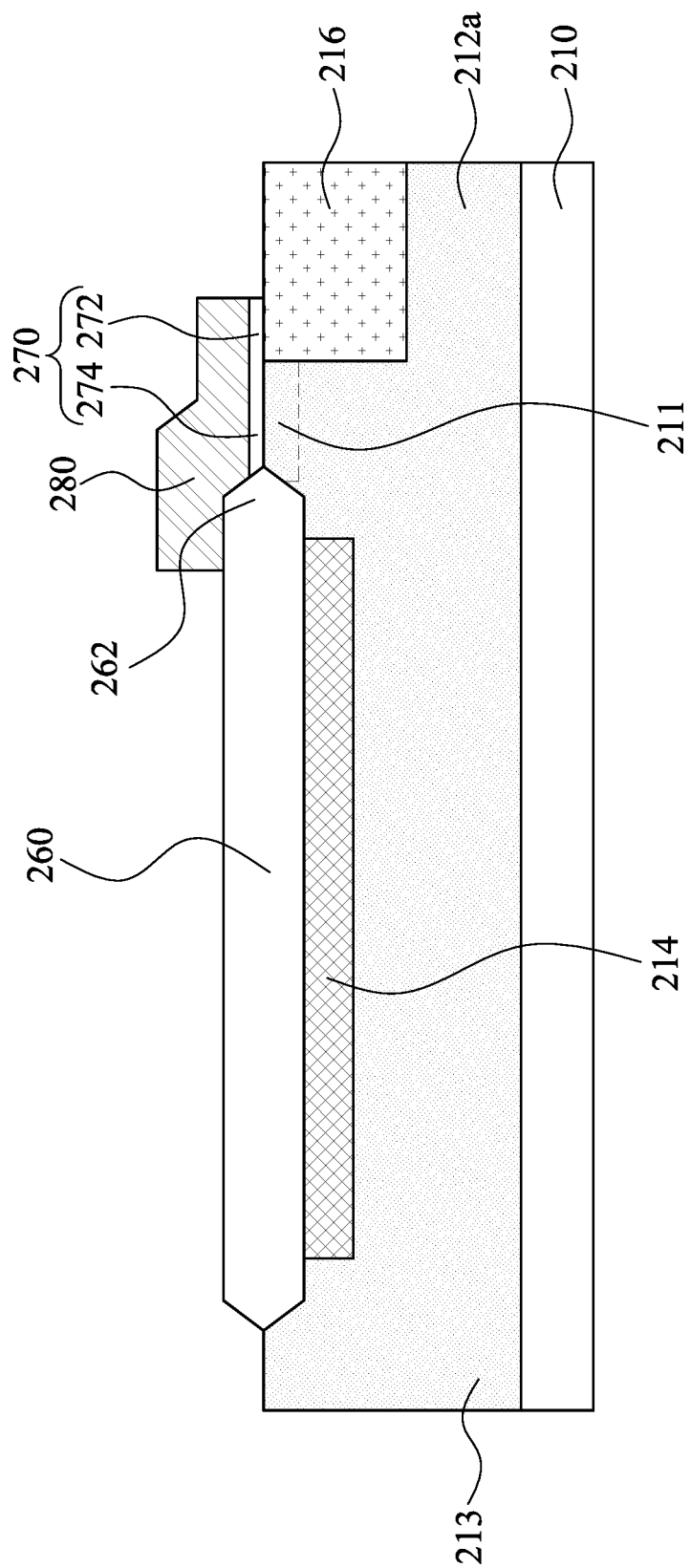

Referring to FIG. 1B and FIG. 14, the method 100 continues with operation S126 in which a gate structure 280 is formed extending from the isolation structure 260 to the well region 216. In greater details, a gate dielectric layer 270 is formed over the well region 216 and the top portion 211 of the drift well 212a. After the gate dielectric layer 270 is formed, the gate structure 280 is formed over the isolation structure 260 and the gate dielectric layer 270.

In some embodiments, the gate dielectric layer 270 has a portion 272 between the gate structure 280 and the well region 216. In other words, the portion 272 of the gate dielectric layer 270 covers a portion of the well region 216. In some embodiments, the gate dielectric layer 270 has a portion 274 between the gate structure 280 and the top portion 211 of the drift well 212a. In other words, the portion 274 of the gate dielectric layer 270 covers the top portion 211 of the drift well 212a.

In some embodiments, the gate dielectric layer 270 may include a silicon oxide layer. Alternatively, the gate dielectric layer 270 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO$_2$, or combinations thereof. The gate dielectric layer 270 may have a multilayer structure such as one layer of silicon oxide and another layer of high k material. The gate dielectric layer 270 may be formed using chemical vapor deposition (CVD), physical vapor deposition (PVD), atomic layer deposition (ALD), thermal oxide, other suitable processes, or combinations thereof.

In some embodiments, the gate structure 280 has a portion over the gate dielectric layer 270 and the other portions over the isolation structure 260. In other words, the gate structure 280 covers the peak portion 262 of the isolation structure 260. Stated differently, the gate structure 280 is in contact with the isolation structure 260 and the gate dielectric layer 270. In some embodiments, the gate structure 280 may include a doped or non-doped polycrystalline silicon (or polysilicon). Alternatively, the gate structure 280 may include a metal such as Al, Cu, W, Ti, Ta, TiN, TaN, NiSi, CoSi, other suitable conductive materials, or combinations thereof. The gate structure 280 may be formed by chemical vapor deposition (CVD), physical vapor deposition (PVD), atomic layer deposition (ALD), plating, and other suitable processes. The gate structure 280 may have a multilayer structure and may be formed in a multiple-step process.

In some embodiments, forming the gate dielectric layer 270 and the gate structure 280 over the drift well 212a may include a patterning process. One exemplary method for patterning the gate dielectric layer 270 and the gate structure 280 is described below. A dielectric layer and a conductive layer are sequentially formed above the structure shown in FIG. 13, and a photoresist layer is formed on the conductive layer by a suitable process, such as spin-on coating, and then patterned to form a patterned photoresist layer by a suitable photolithography technique. The dielectric layer and the conductive layer are etched using the patterned photoresist layer as an etch mask to form the gate dielectric layer 270 and the gate structure 280. Thereafter, the photoresist layer may be removed by using a photoresist strip process, such as an ashing process.

Figure 15:
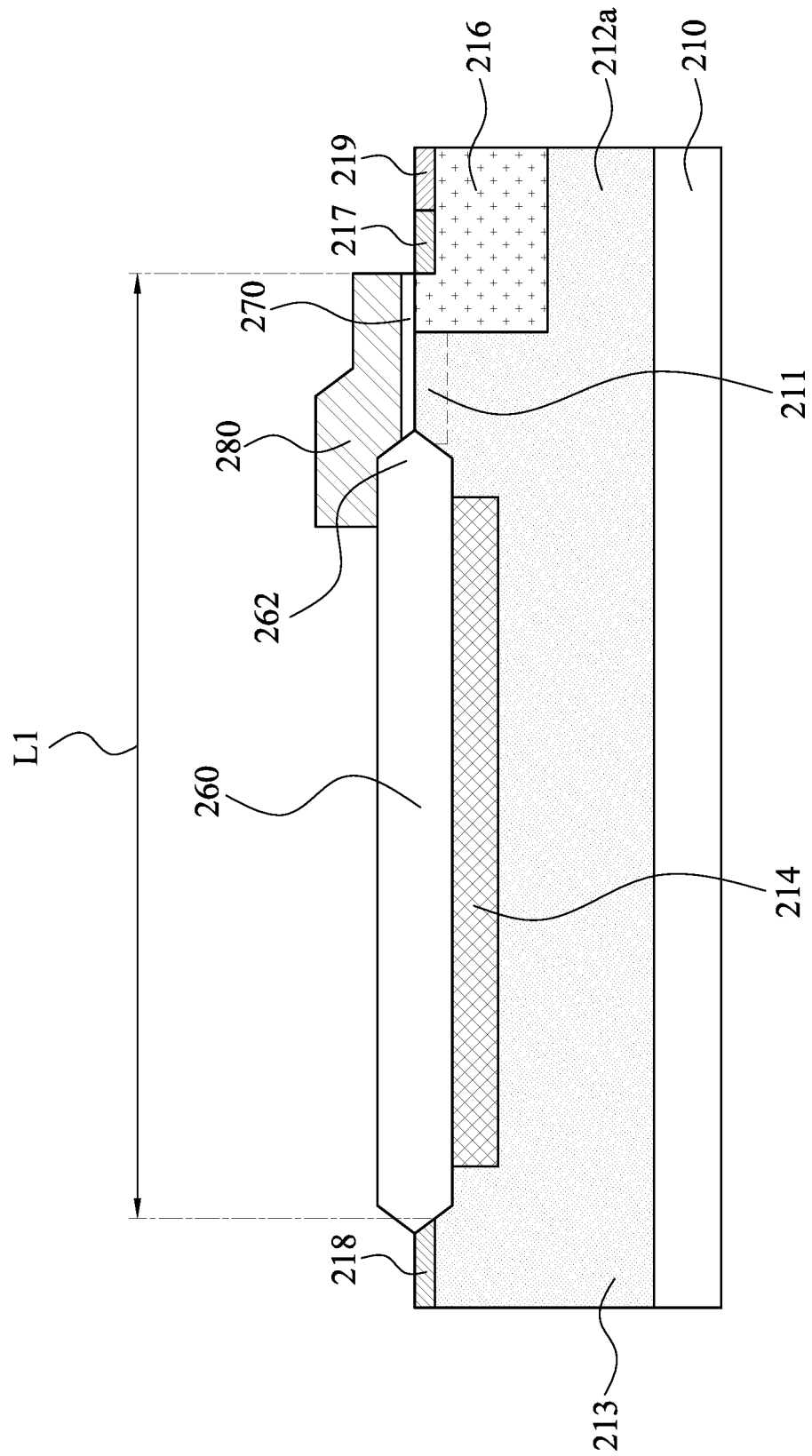

Referring to FIG. 1B and FIG. 15, the method 100 continues with operation S128 in which a source region 217 is formed in the well region 216 and a drain region 218 is formed in the drift well 212a. In greater details, the source region 217 in the well region 216 and the drain region 218 in the drift well 212a may be formed by performing implantation processes respectively on the well region 216 and the drift well 212a. Thereafter, an annealing process is performed to activate the implanted dopants. The source region 217 in the well region 216 and the drain region 218 in the drift well 212a may also be referred to as active regions. In some embodiments, the source region 217 in the well region 216 and the drain region 218 in the drift well 212a may be doped with same dopants. For example, the source region 217 in the well region 216 and the drain region 218 in the drift well 212a may be doped with N-type dopants such as phosphorous (P), arsenic (As), antimony (Sb), combinations thereof, or the like.

In some embodiments, the isolation structure 260 is located between the drain region 218 and the source region 217. The source region 217 and the drain region 218 are formed on opposite sides of the gate structure 280. A distance L1 between the source region 217 and the drain region 218 may be referred as a channel length. In some embodiments, the top portion 211 of the drift well 212a is located between the drain region 218 and the source region 217.

In some embodiments, a bulk region 219 is formed in the well region 216. The bulk region 219 in the well region 216 may be formed by performing an implantation process on the drift well 212a. Thereafter, an annealing process is performed to activate the implanted dopants. The bulk region 219 in the well region 216 and the source region 217 in the Well region 216 may be doped with different dopants. For example, the bulk region 219 in the well region 216 is doped with p-type dopants such as boron (B), BF$_2$, or BF$_3$, combinations thereof, or the like. In other embodiments, the bulk region 219 in the well region 216 and the drain region 218 in the drift well 212a may be doped with different dopants.

In some embodiments, the bulk region 219 is formed in the corner of the drift well 212a. The bulk region 219 is adjacent to the source region 217. The source region 217 is located between the bulk region 219 and the drain region 218.

It is noted that in the embodiments shown in FIGS. 1A-15, the first conductivity type is N-type, and the second conductivity type is P-type. In some other embodiments, however, the first conductivity type is P-type, and the second conductivity type is N-type.

Figure 16:
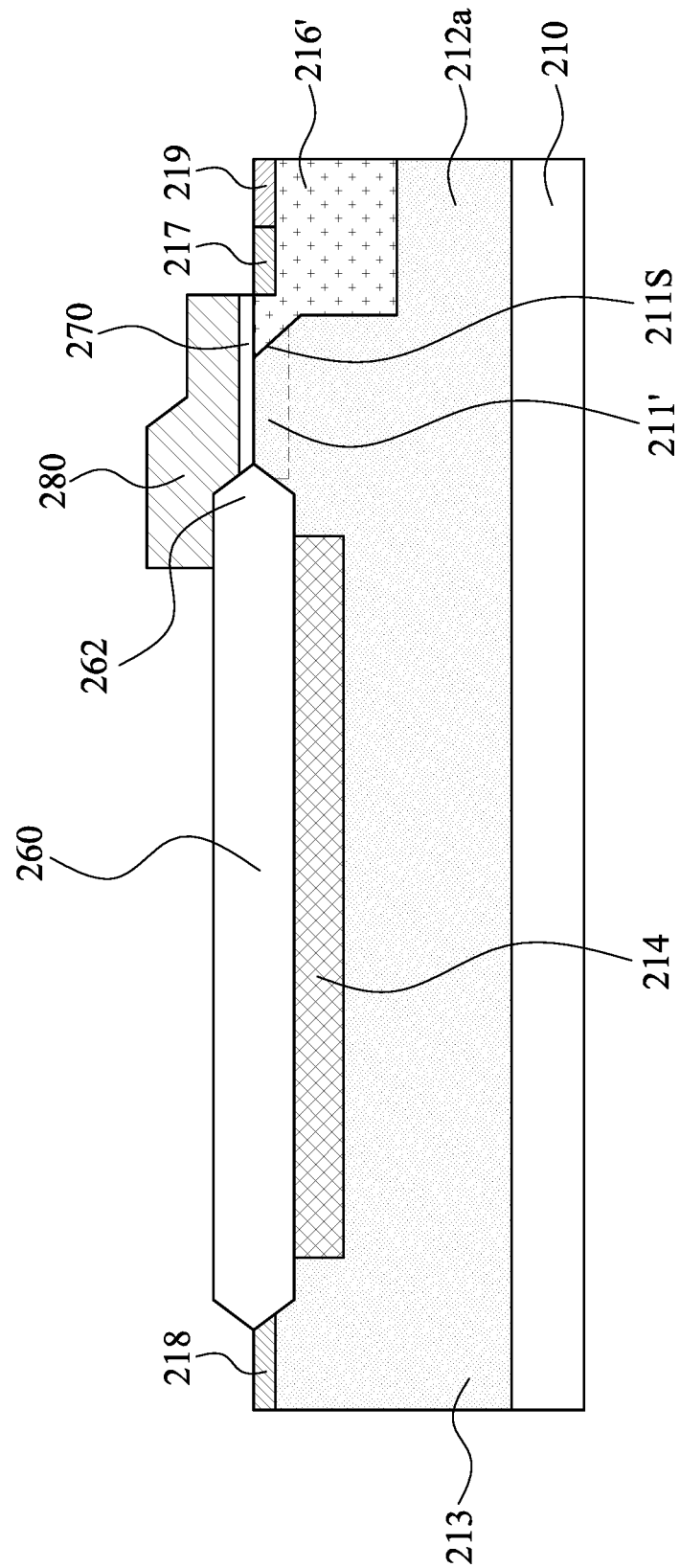
FIG. 16 is a cross-sectional view of a semiconductor structure in accordance with another embodiment of the present disclosure.

FIG. 16 is a cross-sectional view of a semiconductor structure 200' in accordance with another embodiment of the present disclosure. As shown in FIG. 16, the semiconductor structure 200' includes the substrate 210, the drift well 212a, the isolation structure 260, a well region 216', and the gate structure 280. The difference between the semiconductor structure 200' in FIG. 16 and the semiconductor structure 200 in FIG. 15 pertains to the profile of the well region 216'. The connection relationships and materials of the substrate 210, the drift well 212a, the isolation structure 260, and the gate structure 280 are similar to the semiconductor structure 200 shown in FIG. 15 and the description is not repeated hereinafter.

As shown in FIG. 16, the well region 216' has an inclined portion adjacent to a top portion 211' of the drift well 212a. As such, the top portion 211' of the drift well 212a has an inclined sidewall 211S in contact with the inclined portion of the well region 216'.

Figure 17:
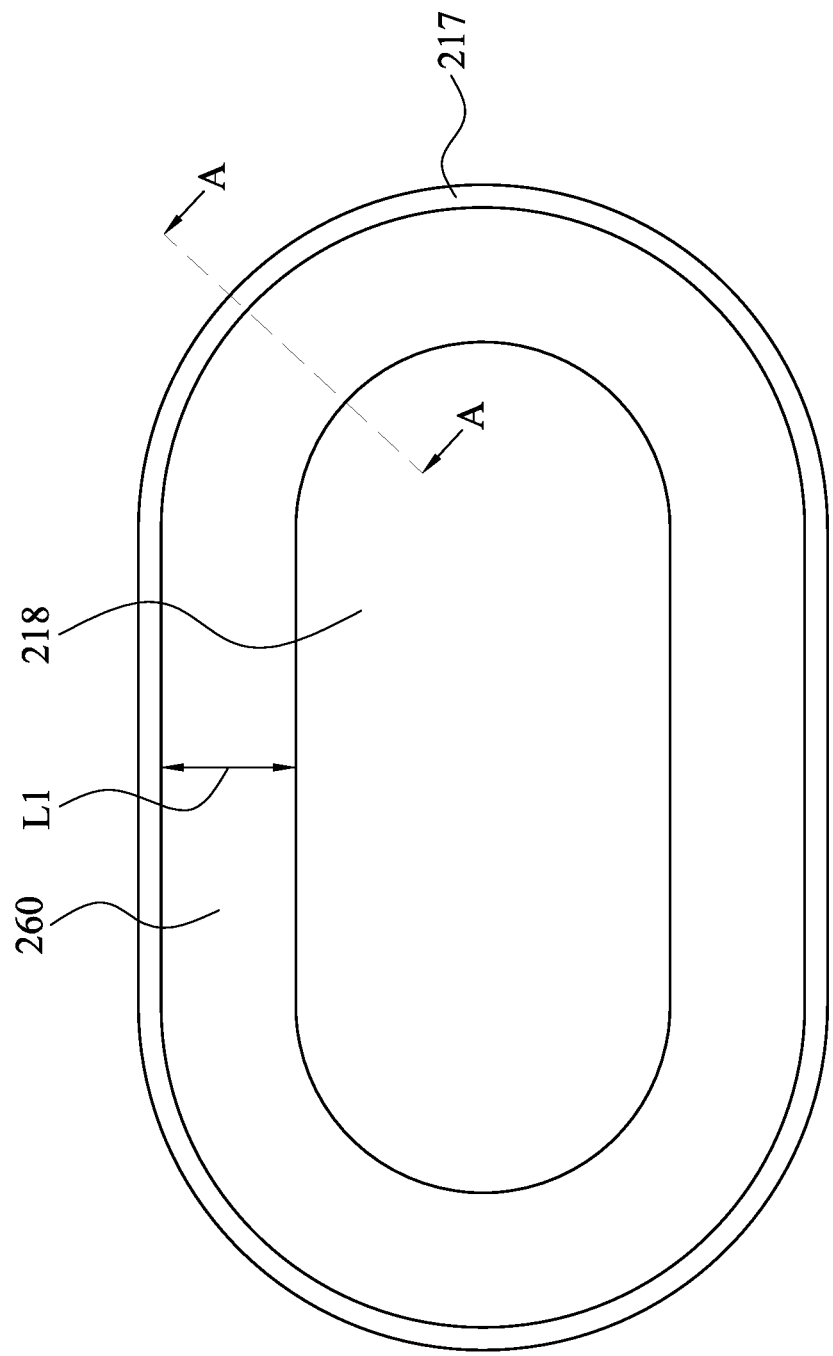
FIG. 17 is a top view of a layout of the semiconductor structure shown in FIG. 15.

FIG. 17 is a top view of a layout of the semiconductor structure 200 shown in FIG. 15, in which the gate structure 280 and the gate dielectric layer 270 (see FIG. 15) are omitted for clarity. In some embodiments, FIG. 15 is a cross-sectional view taken along line A-A in FIG. 17. As shown in FIG. 17, the drain region 218 is surrounded by the source region 217. The isolation structure 260 is located between the source region 217 and the drain region 218, and a portion of the drift well 212a directly under the isolation structure 260 is referred as a channel region. The distance L1 is between the source region 217 and the drain region 218. The drain region 218 has an elliptical profile. The isolation structure 260 and the source region 217 surround the drain region 218, and each have an elliptical ring profile. In the present embodiments, the layout design may be applied to an ultra-high voltage semiconductor device such as ultra-high voltage LDMOS transistor.

Figure 18:
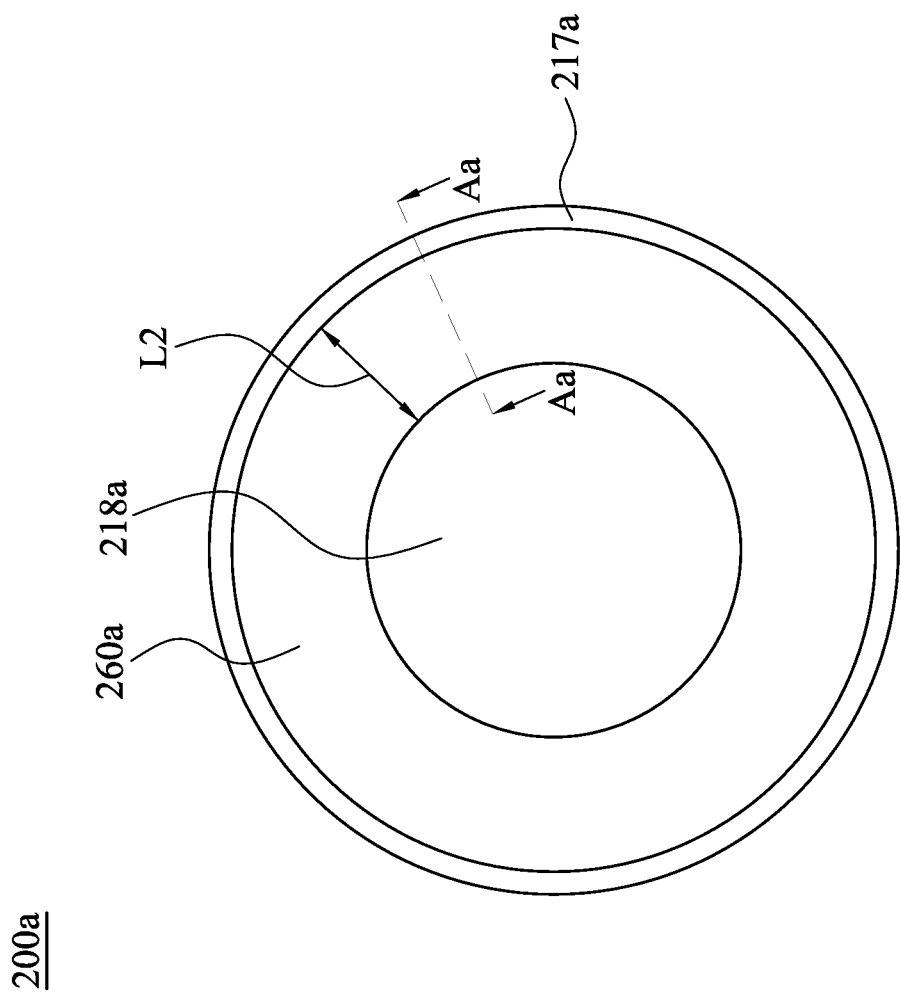
FIG. 18 is a top view of a layout of a semiconductor structure in accordance with another embodiment of the present disclosure.

FIG. 18 is a top view of a layout of a semiconductor structure 200a in accordance with another embodiment of the present disclosure. In some embodiments, FIG. 15 is a cross-sectional view taken along line Aa-Aa in FIG. 18. As shown in FIG. 18, the semiconductor structure 200a includes a drain region 218a, an isolation structure 260a, and a source region 217a. The difference between the semiconductor structure 200a in FIG. 18 and the semiconductor structure 200 in FIG. 17 pertains to the layout design. The connection relationships and materials of the drain region 218a, the isolation structure 260a, and the source region 217a are similar to the semiconductor structure 200 shown in FIG. 17 and the description is not repeated hereinafter.

As shown in FIG. 18, the drain region 218a is surrounded by the source region 217a. The isolation structure 260a is located between the source region 217a and the drain region 218a and a portion of the drift region directly under the isolation structure 260a is referred as a channel region. The distance L2 is between the source region 217a and the drain region 218a. In some embodiments, the distance L2 between the source region 217a and the drain region 218a is substantially equal to the distance L1 between the source region 217 and the drain region 218 in FIG. 17. The drain region 218a has a circle profile. The isolation structure 260a and the source region 217a surround the drain region 218a, and thus have circular ring profiles.

Figure 19:
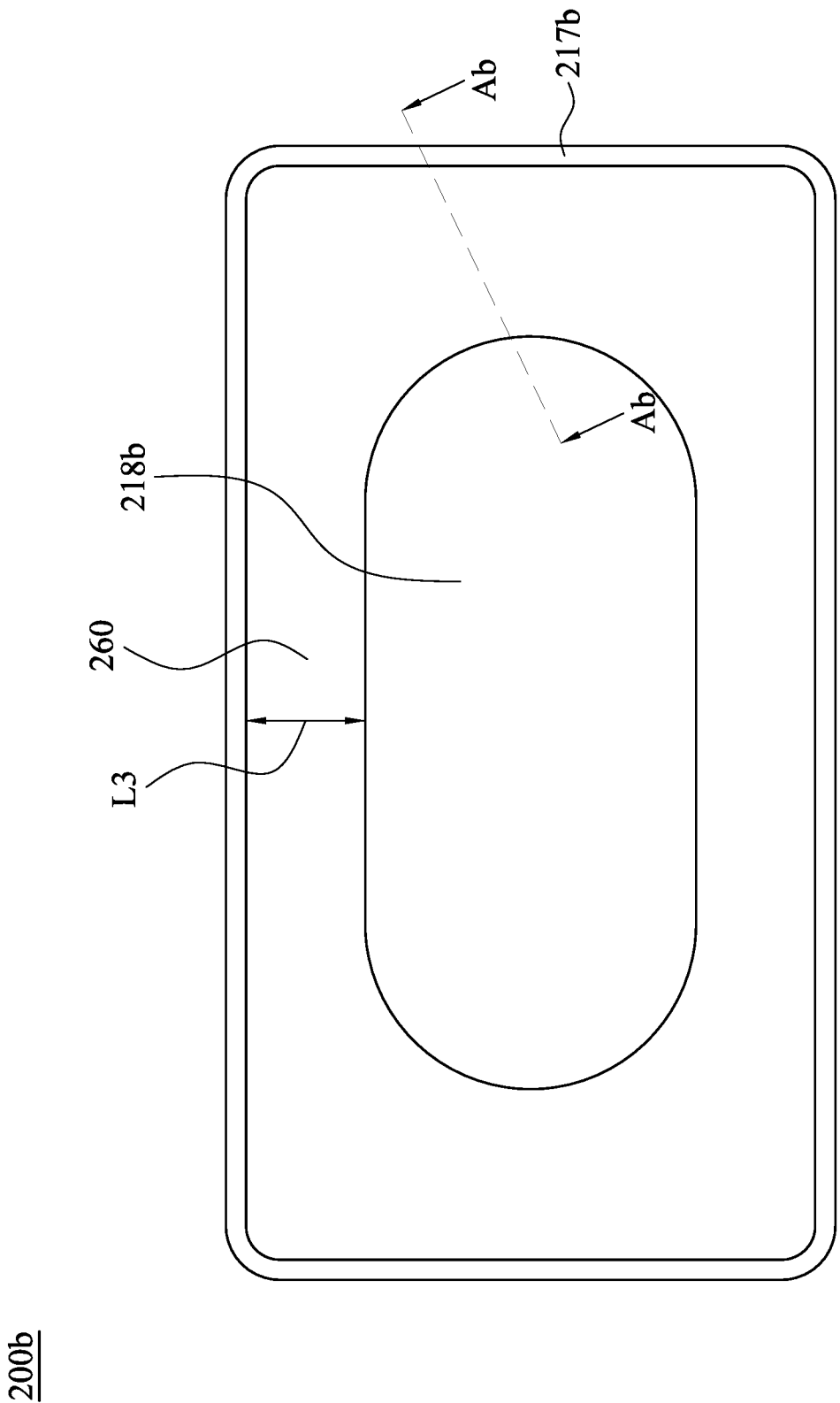
FIG. 19 is a top view of a layout of a semiconductor structure in accordance with another embodiment of the present disclosure.

FIG. 19 is a top view of a layout of a semiconductor structure 200b in accordance with another embodiment of the present disclosure. In some embodiments, FIG. 15 is a cross-sectional view taken along line Ab-Ab in FIG. 19. As shown in FIG. 19, the semiconductor structure 200b includes a drain region 218b, an isolation structure 260b, and a source region 217b. The difference between the semiconductor structure 200b in FIG. 19 and the semiconductor structure 200 in FIG. 17 pertains to the layout design. The connection relationships and materials of the drain region 218b, the isolation structure 260b, and the source region 217b are similar to the semiconductor structure 200 shown in FIG. 17 and the description is not repeated hereinafter.

As shown in FIG. 19, the drain region 218b is surrounded by the source region 217b. The isolation structure 260b is located between the source region 217b and the drain region 218b and a portion of the drift region directly under the isolation structure 260b is referred as a channel region. The distance L3 is between the source region 217b and the drain region 218b. In some embodiments, the distance L3 between the source region 217b and the drain region 218b in FIG. 19 is substantially equal to the distance L1 between the source region 217 and the drain region 218 in FIG. 17. The drain region 218b has an elliptical profile. The isolation structure 260b and the source region 217b surround the drain region 218b, and each have an approximate rectangular ring profile with circle edges.

Figure 20:
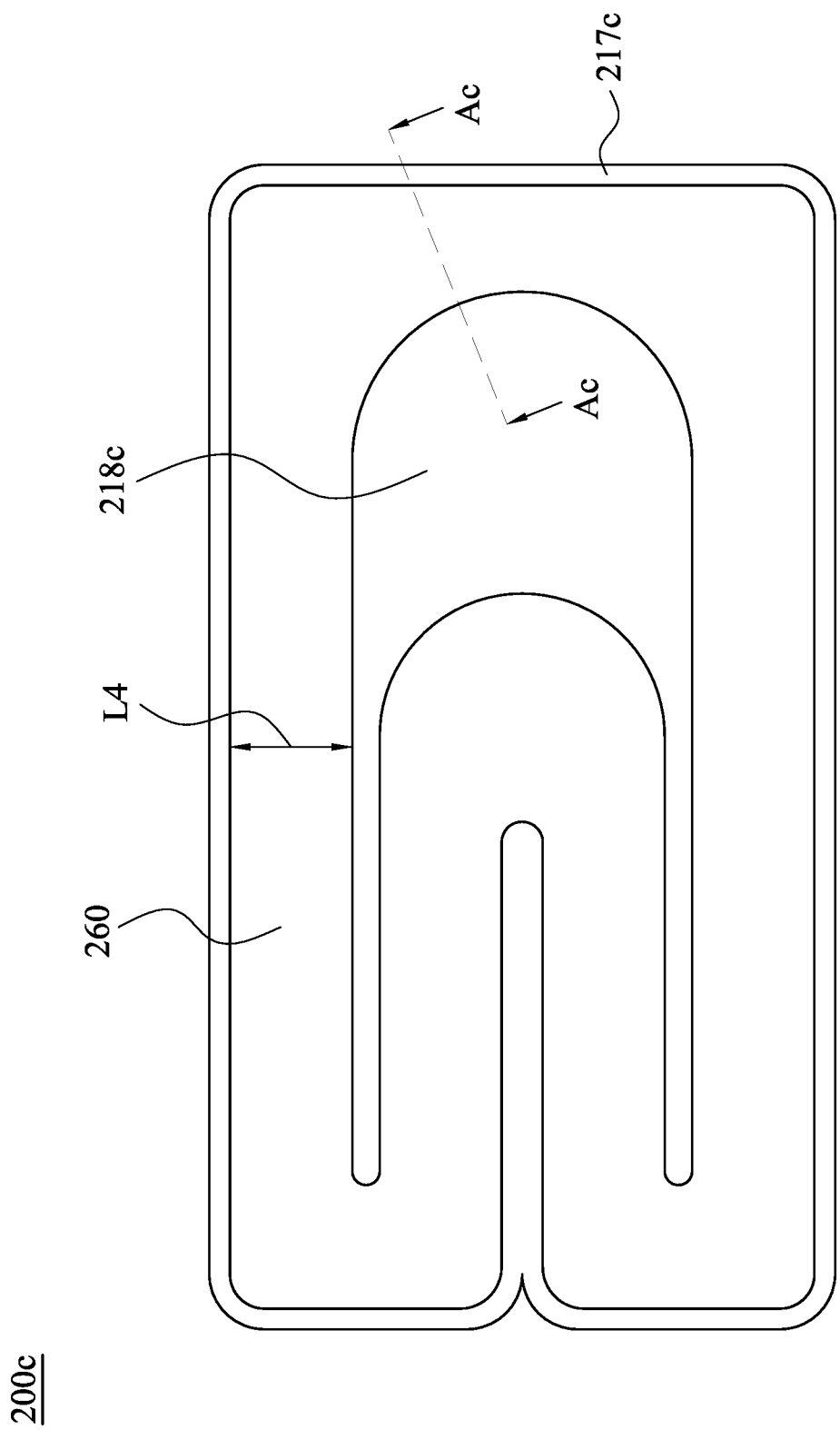
FIG. 20 is a top view of a layout of a semiconductor structure in accordance with another embodiment of the present disclosure.

FIG. 20 is a top view of a layout of a semiconductor structure 200c in accordance with another embodiment of the present disclosure. In some embodiments, FIG. 15 is a cross-sectional view taken along line Ac-Ac in FIG. 20. As shown in FIG. 20, the semiconductor structure 200c includes a drain region 218c, an isolation structure 260c, and a source region 217c. The difference between the semiconductor structure 200c in FIG. 20 and the semiconductor structure 200 in FIG. 17 pertains to the layout design. The connection relationships and materials of the drain region 218c, the isolation structure 260c, and the source region 217c are similar to the semiconductor structure 200 shown in FIG. 17 and the description is not repeated hereinafter.

As shown in FIG. 20, the drain region 218c is surrounded by the source region 217c. The isolation structure 260c is located between the source region 217c and the drain region 218c and a portion of the drift region directly under the isolation structure 260c is referred as a channel region. The distance L4 is between the source region 217c and the drain region 218c. In some embodiments, the distance L4 between the source region 217c and the drain region 218c in FIG. 20 is substantially equal to the distance L1 between the source region 217 and the drain region 218 in FIG. 17. The drain region 218c has a curved profile, for example, a U-shaped profile. The isolation structure 260c and the source region 217c surround the drain region 218c, and each have the curved profile.

Based on the aforementioned descriptions, since a doping modification region (i.e., the top portion of the drift well) is formed in the drift well and adjacent/in contact with the peak portion of the isolation structure, the net doping concentration of the top portion of the drift region is less than the other regions of the drift well to achieve a charge balance, and the electric field near the peak portion of the isolation structure can be reduced and thus the breakdown voltage can be increased. Accordingly, sufficient breakdown voltage and higher breakdown voltage can be achieved and the performance of the semiconductor structure can be improved. Further, the formation of the doping modification region may use a mask the same as that used in forming the well region, such that the formation of the doping modification region does not increase the manufacturing cost.

According to some embodiments of the present embodiments, a method of forming a semiconductor structure including: forming a drift well in a substrate, in which the drift well includes first dopants having a first conductivity type; forming an isolation structure over the drift well; forming a well region in the drift well and spaced apart from the isolation structure, such that a top portion of the drift well is between the well region and the isolation structure; doping the top portion with second dopants having a second conductivity type different from the first conductivity type, such that a doping concentration of the second dopants in the top portion is lower than a doping concentration of the first dopants in the top portion after doping the top portion; and forming a gate structure extending from the isolation structure to the well region and covering the top portion of the drift well.

According to some embodiments of the present embodiments, a method of forming a semiconductor structure including: forming a drift well in a substrate; forming an isolation structure over the drift well; forming a mask to cover the isolation structure while exposing a first portion of the drift well; performing a first implantation process on the first portion of the drift well using the mask to form a well region in the drift well and spaced apart from the isolation structure; performing a second implantation process with an oblique angle θ on a second portion of the drift well adjacent the well region using the mask to form a doping modification region in the second portion of the drift well; and forming a gate structure extending from the isolation structure to the well region.

According to some embodiments of the present embodiments, a semiconductor structure includes a drift well, an isolation structure, a well region, and a gate structure. The drift well is disposed in a substrate and includes a top portion and a bottom portion, in which the top portion and the bottom portion both are regions of a first conductivity type. The isolation structure is disposed on the drift well and adjacent the top portion of the drift well. The well region is disposed in the drift well, in which the top portion of the drift well is between the well region and the isolation structure, a doping concentration of first dopants having a second conductivity type in the top portion is greater than a doping concentration of second dopants having the second conductivity type in the bottom portion, and the second conductivity type is different from the first conductivity type. The gate structure extends from the isolation structure to the well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a drift well in a substrate, wherein the drift well comprises first dopants having a first conductivity type;
forming an isolation structure over the drift well;
forming a well region in the drift well and spaced apart from the isolation structure, such that a top portion of the drift well is between the well region and the isolation structure;
doping the top portion with second dopants having a second conductivity type different from the first conductivity type, such that a doping concentration of the second dopants in the top portion is lower than a doping concentration of the first dopants in the top portion after doping the top portion; and
forming a gate structure extending from the isolation structure to the well region and covering the top portion of the drift well.

2. The method of claim 1, wherein forming the well region comprises doping the drift well with third dopants having the second conductivity type, such that a doping concentration of the third dopants in the well region is higher than a doping concentration of the first dopants in the well region.

3. The method of claim 1, wherein the doping concentration of the second dopants in the top portion is in a range of about 1E12 atoms/cm$^3$ to about 1E15 atoms/cm$^3$.

4. The method of claim 1, wherein doping the top portion is performed such that the top portion is in contact with the isolation structure and the well region.

5. The method of claim 1, further comprising:
forming a doped region below the isolation structure and in the drift well prior to doping the top portion of the drift well.

6. The method of claim 5, wherein forming the doped region comprises doping the doped region with fourth dopants having the second conductivity type, such that a doping concentration of the fourth dopants in the doped region is higher than a doping concentration of the first dopants in the doped region.

7. The method of claim 1, further comprising:
forming a gate dielectric layer over the well region and the top portion of the drift well.

8. The method of claim 1, further comprising:
forming a source region in the well region and a drain region in the drift well, wherein the isolation structure is between the source region and the drain region.

9. A method, comprising:
forming a drift well in a substrate, wherein forming the drift well in the substrate comprises doping the substrate with first dopants having a first conductivity type;
forming an isolation structure over the drift well;
forming a mask to cover the isolation structure while exposing a first portion of the drift well;
performing a first implantation process on the first portion of the drift well using the mask to form a well region in the drift well and spaced apart from the isolation structure;
performing a second implantation process with an oblique angle on a second portion of the drift well adjacent the well region using the mask to form a doping modification region in the second portion of the drift well, wherein performing the second implantation process comprises doping the second portion of the drift well with second dopants having a second conductivity type different from the first conductivity type, and doping the second portion of the drift well with the second dopants is performed such that the second portion of the drift well remains the first conductivity type; and forming a gate structure extending from the isolation structure to the well region.

10. The method of claim 9, wherein doping the second portion of the drift well with the second dopants is performed such that a net doping concentration of the second portion is reduced.

11. The method of claim 9, wherein the second implantation process is performed with the oblique angle in a range of 5 degrees to 65 degrees.

12. The method of claim 9, further comprising removing the mask after performing the second implantation process.

13. The method of claim 9, wherein performing the first implantation process comprises doping the first portion of the drift well with third dopants having the second conductivity type.

14. The method of claim 9, wherein the second implantation process is performed such that the doping modification region is directly between the well region and the isolation structure.

15. A method, comprising:
forming a drift well in a substrate, wherein the drift well has a top portion and a bottom portion that both are doped with first dopants of a first conductivity type;
forming an isolation structure over the drift well and adjacent to the top portion of the drift well;
forming a well region in the drift well with second dopants having a second conductivity type different from the first conductivity type, wherein the top portion of the drift well is directly between the well region and the isolation structure;
doping the top portion of the drift well with third dopants having the second conductivity type such that the top portion has a doping concentration of the third dopants having the second conductivity type greater than a doping concentration of the second dopants having the second conductivity type in the bottom portion of the drift well and less than a doping concentration of the second dopants having the second conductivity type in the well region; and
forming a gate structure extending from the isolation structure to the well region and covering the top portion of the drift well.

16. The method of claim 15, further comprising:
forming a drain region in the drift well and a source region in the well region such that the isolation structure is between the drain region and the source region.

17. The method of claim 15, further comprising:
doping the drift well with fourth dopants having the second conductivity type to form a doped region below the isolation structure prior to forming the well region.

18. The method of claim 15, wherein forming the well region comprises performing a first implantation process, and an implantation direction of the first implantation process is substantially normal to a top surface of the drift well.

19. The method of claim 15, wherein doping the top portion of the drift well is performed by a second implantation process, and an implantation direction of the second implantation process is oblique with a normal direction of a top surface of the drift well.

20. The method of claim 15, wherein doping the top portion of the drift well with the third dopants having the second conductivity type is performed such that the top portion of the drift well is of the first conductivity type.

* * * * *